United States Patent
Meltzer et al.

(10) Patent No.: US 7,038,497 B2
(45) Date of Patent: May 2, 2006

(54) DIFFERENTIAL CURRENT MODE PHASE/FREQUENCY DETECTOR CIRCUIT

(75) Inventors: David Meltzer, Wappingers Falls, NY (US); Muralikumar A. Padaparambil, Poughkeepsie, NY (US); Tat C. Wu, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/833,397

(22) Filed: Apr. 28, 2004

(65) Prior Publication Data

US 2005/0242843 A1     Nov. 3, 2005

(51) Int. Cl.
*G01R 23/02*     (2006.01)

(52) U.S. Cl. .................. 327/47; 327/3; 327/7; 327/12; 327/40

(58) Field of Classification Search .............. 327/2, 327/3, 7, 8, 12, 39–43, 47, 49, 52, 54–57, 327/162, 163, 202, 203, 208, 218, 211–213
See application file for complete search history.

(56) References Cited

U.S. PATENT DOCUMENTS

| | | | | |
|---|---|---|---|---|
| 4,904,948 | A * | 2/1990 | Asami | 327/3 |
| 5,266,851 | A * | 11/1993 | Nukui | 327/3 |
| 5,422,603 | A * | 6/1995 | Soyuer | 331/1 A |
| 5,691,656 | A * | 11/1997 | Sandusky | 327/7 |
| 5,691,669 | A | 11/1997 | Tsai et al. | 331/17 |
| 6,218,868 | B1 * | 4/2001 | Katoh | 327/12 |
| 6,285,219 | B1 * | 9/2001 | Pauls | 327/3 |
| 6,407,642 | B1 * | 6/2002 | Dosho et al. | 331/11 |
| 6,411,142 | B1 | 6/2002 | Abbasi et al. | 327/156 |
| 6,590,949 | B1 * | 7/2003 | Marten et al. | 375/376 |
| 6,605,935 | B1 * | 8/2003 | Nilsson | 324/76.53 |
| 6,741,102 | B1 * | 5/2004 | Thomas | 327/3 |
| 6,771,096 | B1 * | 8/2004 | Meyers et al. | 327/3 |
| 6,798,263 | B1 * | 9/2004 | Leon | 327/203 |
| 2002/0114416 | A1 * | 8/2002 | Enam et al. | 375/373 |
| 2002/0118006 | A1 | 8/2002 | Enam et al. | 324/76.53 |
| 2002/0122438 | A1 | 9/2002 | Enam et al. | 370/518 |
| 2002/0154722 | A1 | 10/2002 | Djahanshahi et al. | 375/375 |
| 2004/0051563 | A1 | 3/2004 | Zhang | 326/115 |

OTHER PUBLICATIONS

Zhinian Shu, Ka Lok Lee, and Bosco H. Leung; "A 2.4-GHz Ring-Oscillator-Based CMOS Frequency Synthesizer With a Fractional Divider Dual-PLL Architecture", IEEE Journal of Solid-State Circuits, vol. 39, No. 3, Mar. 2004, XP-002339975.

(Continued)

*Primary Examiner*—Timothy P. Callahan
*Assistant Examiner*—Hai L. Nguyen
(74) *Attorney, Agent, or Firm*—Rosalio Haro

(57) ABSTRACT

A fully differential phase and frequency detector utilizes a multi-function differential logic gate to implement a differential AND gate operation and provides a fully differential D-flip-flop. The multi-function differential logic gate has four inputs, which can be grouped into two pairs of true and complement signals. By selectively re-assigning the inputs to different signal pairs, the differential logic gate can be made to provide one of either simultaneous AND/NAND logic operations or simultaneous OR/NOR logic operations. The differential D-flip-flop is implemented following a master/slave configuration and is response to the true and complement forms of an input clock signal, an input reset input, and input data signal, and also provides true and complement forms of an output signal. All components within the phase and frequency detector are exemplified in CML circuit configuration.

52 Claims, 7 Drawing Sheets

OTHER PUBLICATIONS

Saman Adham, Dhamin Al-Khalili, Come Rozon, Douglas Racz; "Comprehensive Defect Analysis and Testability Of Current-Mode Logic Circuits" Circuits And Systems, ISCAS 2000, IEEE International Symposium on Circuits and Systems, May 28-31, 2000, Geneva, Switzerland, Pis cataway, NJ, USA, IEEE, vol. 1, May 2000, pp. I-339-I-342, XP010503204.

Hans-Dieter Wohlmuth, Daniel Kehrer, Ronald Thuringer and Werner Simburger, "A 17 GHz Dual-Modulus Prescaler in 120nm CMOS", 2003 IEEE Radio Frequency Integrated Circuits Symposium, pp. 479-482, XP010646739.

* cited by examiner

DIFFERENTIAL CURRENT MODE PHASE/FREQUENCY DETECTOR CIRCUIT

BACKGROUND OF THE INVENTION

1. Field of the Invention

The present invention relates generally to CMOS phase and frequency detector (PFD) circuits used in the locking of phase locked loops (PLL) and delay locked loops (DLL). This invention relates more specifically to very high speed CMOS logic implementations of such circuits.

2. Description of the Related Art

High speed phase locked loops (PLL) are used in modern communication systems for many purposes, including clock generation and data recovery and retiming. Typically, the input signal for the reference input of a PLL is a differential signal where the crossing of the true and complement signals represents the clock transition. However, phase and frequency detector circuits (PFD) used for clock multiplication and generation are typically single-ended circuits. When a differential reference signal is provided to a PFD, either a differential to single phase conversion is done or only one phase of the differential signal is used for the PFD circuit.

It is well known that differential CMOS circuits, especially current mode logic circuits (CML), are generally faster and generate lower noise than single-ended CMOS circuits, but since PFD circuits are single-ended circuits they cannot take advantage of the benefits of differential signaling.

With reference to FIG. 1, a known PFD architecture is composed of two single-ended, edge triggered D-flip-flops 1 and 3 with asynchronous reset and one AND gate 5. There exists a complementary but similar architecture using an OR gate. D-flip-flops 1 and 3 are conventionally implemented with CMOS logic circuits, although other implementations with other single-ended logic families using NFETs and PFETS in non-complementary configurations are known.

OBJECTS OF THE INVENTION

It is an object of the present invention is to provide a phase and frequency detector having a differential architecture so that its operation can be performed at the highest possible frequency and with low noise generation.

It is a further object of the present invention to provide differential architectural forms of the components comprising a PFD.

SUMMARY OF THE INVENTION

The above objects are achieved in a phase and frequency detector (PFD) that is fully differential, and is preferably implemented in current mode logic (CML) for high speed operation with low noise generation and higher common mode noise tolerance than voltage based circuits. The PFD of the present invention preferably operates on both a true and complement reference signal (i.e. a reference clock) and true and complement local clock signals simultaneously. To achieve this objective, the present invention provides a fully differential AND gate and two fully differential master/slave latches, or flip-flops.

Preferably, the fully differential AND gate is implemented using a multi-function differential logic gate capable of selectively operation in one of two modes. In a first mode, the multi-function differential logic gate implements simultaneous AND and NAND logic operation. In a second mode, the multi-function differential logic gate implements simultaneous OR and NOR logic operations. Preferably, the multi-function differential logic gate has four inputs grouped into two pairs of logic inputs, with each pair including a logic true and logic complement form of a signal. By electing which of the four inputs are paired together, the multi-function differential logic gate may be made to provide an AND/NAND operation or an OR/NOR operation. Further preferably, the multi-function differential logic gate architecture is suitable for implementation in a CML configuration.

The present invention further preferably provides a fully differential master/slave latch, or flip-flop, circuit. Each flip-flop accepts the true and complement form of an input signal, the true and complement of a clock signal, the true and complement form of a reset signal, and a bias signal for CML support, and provides both true and complement outputs. The flip-flop is divided into a first stage and second stage, with both stages latching input data and tracking input data on opposite phases of the input clock signal. When either stage is tracking input data, their corresponding internal latch is reset and the tracked data is forwarded to their respective true and complement output nodes. When either stage is latching-in and holding data, the latched data is forwarded to their true and complement output nodes while their inputs are disabled. In this manner, when the first stage is tracking input data and forwarding the tracked data to the input of the second stage, the inputs of the second stage are disabled so as to ignore the tracked data from the first stage while the second stage's latched data is forwarded to its output nodes.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

Figure 1:
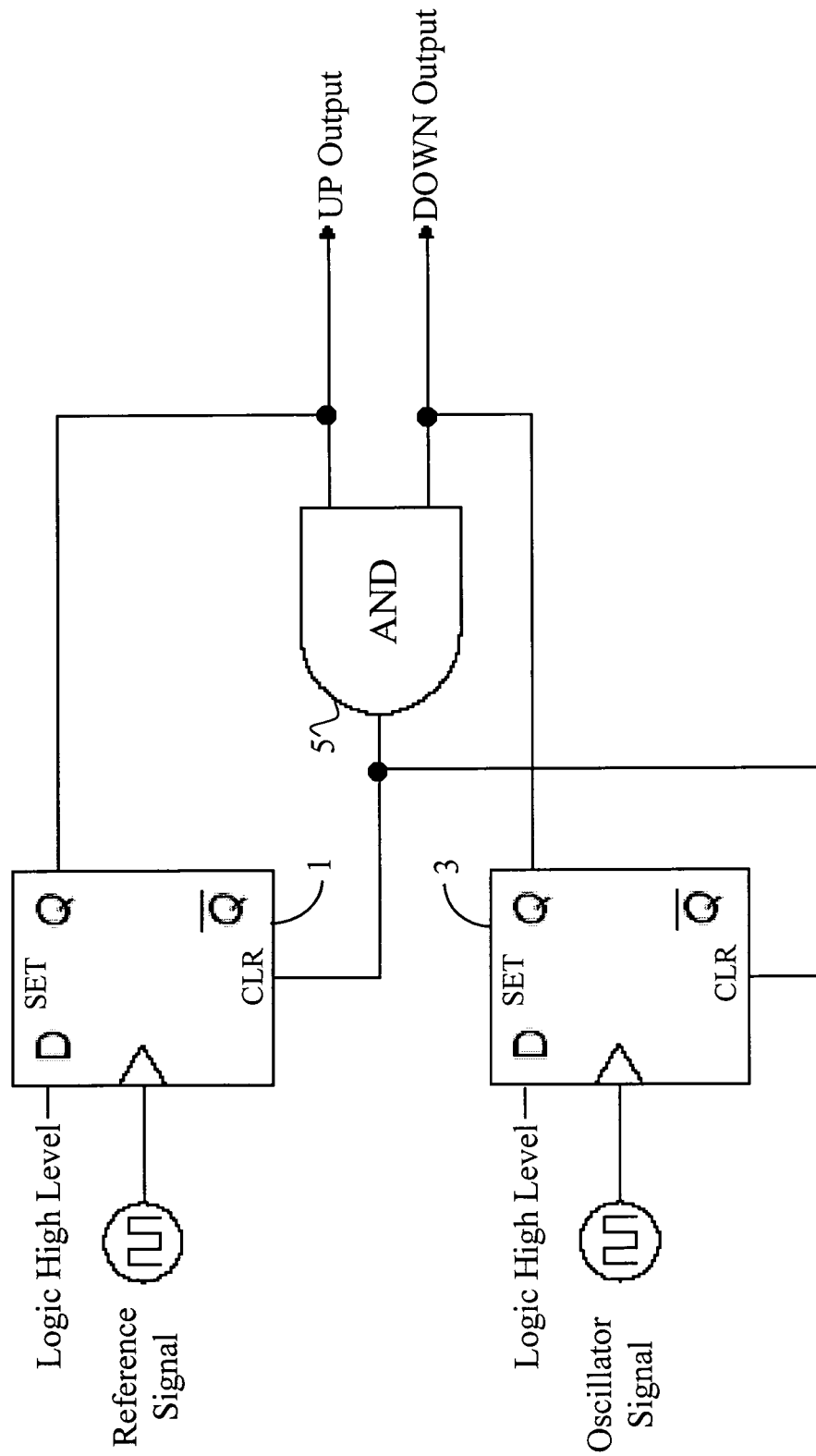
FIG. 1 is a block diagram of a typical phase and frequency detector.
Figure 2:
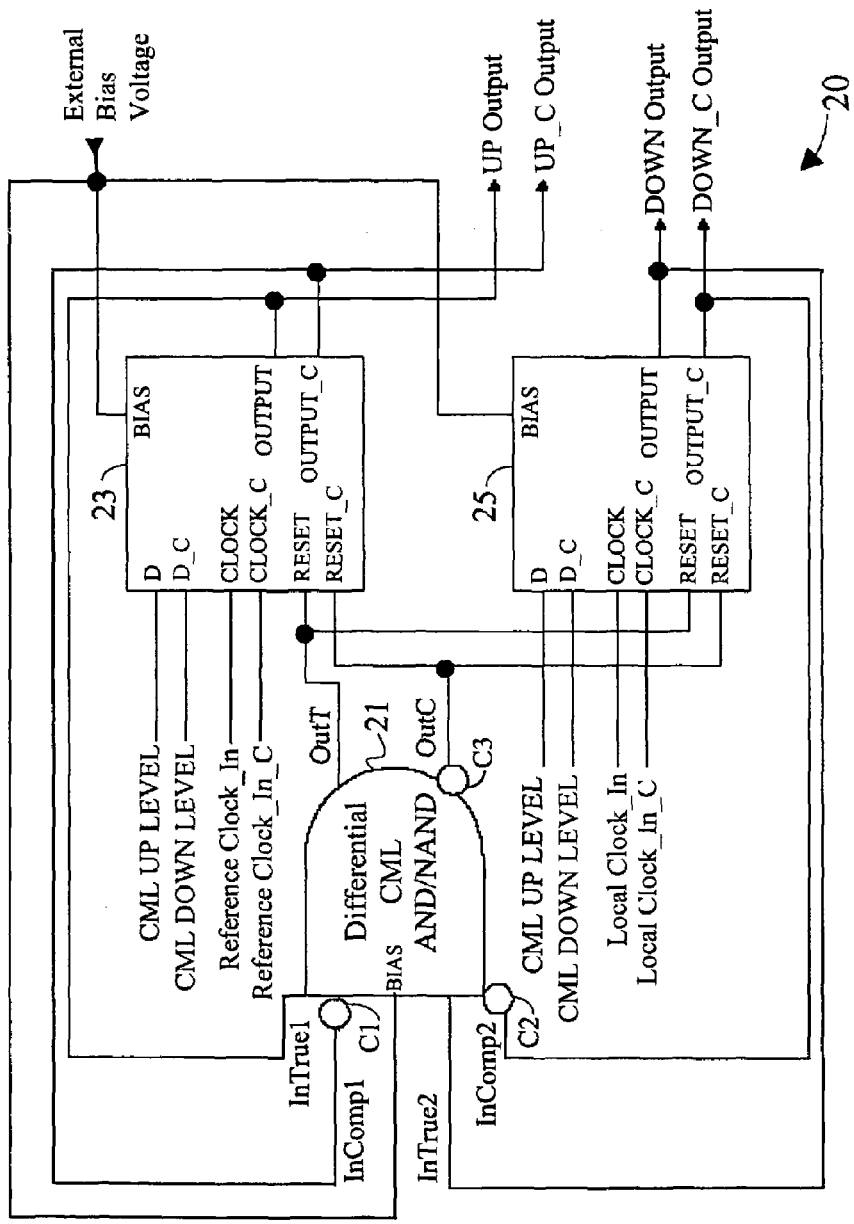
FIG. 2 is a block diagram of a fully differential phase and frequency detector in accord with the present invention.

With reference to FIG. 2, a fully differential phase and frequency detector, PFD, 20 in accord with the present invention utilizes a fully differential AND gate 21, and two fully differential D-flip-flops 23 and 25. In the present embodiment, a fully differential reference clock (i.e. true signal Reference Clock_In and complement signal Reference Clock_In_C) is compared with a fully differential local clock (i.e. true signal Local Clock_In and complement signal Local Clock_In_C). D-flip-flops 23 and 25 also have fully differential UP/UP_C and DOWN/DOWN_C outputs, which are coupled to drive a fully differential charge pump. Such a charge pump is well know, and disclosed, for example, in IEEE JSSC 35:6p 852, which is hereby incorporated in its entirety by reference. Preferably, the differential PFD 20 is implemented in current mode logic, CML, as explained in more detail below, but other differential logic technologies such as low voltage differential signaling, LVDS, may be used.

In general, differential logic devices require two inputs per data logic signal, i.e. a true logic version of a data logic signal and a complement logic version of the data logic signal. Therefore, differential AND gate 21 requires four logic signal inputs (InTrue1, InComp1, InTrue2, and InComp2) to implement the logic operation of a traditional two-input, single-ended AND gate. Furthermore, since the presently preferred embodiment utilizes a CML implementation, differential AND gate 21 also receives a bias signal BIAS to establish its internal operating point, as explained below. Inputs InTrue1 and InTrue2 receive true logic signals similar to a two-input, single-ended AND gate, but inputs InComp1 and InComp2 receive the logic complements of InTrue1 and InTrue2, respectively. That is, InComp1 is the logic compliment of InTrue1, as indicated by a circle C1 at input InComp1, and circle C2 indicates that input InComp2 is the logic compliment of input InTrue2.

Differential AND gate 21 also has two outputs, a true output OutT and a complement output OutC, which is the logic compliment of OutT and is visually indicated by circle C3. OutT outputs the logic AND operation of true inputs InTrue1 and InTrue2, and consequently OutC outputs the logic NAND operation of true inputs InTrue1 and InTrue2.

Differential D-flip-flops 23 and 25 have similar inputs, and operate similarly. Both have a true logic input D and a complement logic input D_C, a true clock input CLOCK and a complement clock input CLOCK_C, a true reset input RESET and a complement reset input RESET_C, a true output node OUTPUT and a complement output node OUTPUT_C. As stated above, the present differential PFD is preferably implemented as a current mode logic circuit, and thus D-flip-flops 23 and 25 further receive input BIAS, which controls the operating point of a respective, internal current source more fully explained below. Also, logic high CML level (UP LEVEL) signals are applied to the D inputs of D-flip-flops 23 and 25 and logic low CML level (DOWN LEVEL) signals are applied to the complement inputs D_C of D-flip-flops 23 and 25.

In operation, each differential D-flip-flop latches in its true D and complement D_C data inputs at the rising edge of its true clock input CLOCK, and simultaneously transfers the latched true and complement data to true output node OUTPUT and complement output node OUTPUT_C, respectively. Equivalently, D-flip-flops 23 and 25 may latch in their true D and complement D_C inputs at the falling edge of their complement clock inputs CLOCK_C, and simultaneously transfer the latched data to their respective output nodes OUTPUT and OUTPUT_C. D-flip-flops 23 and 25 function as described above as long as their input RESET is low and complement input RESET_C is high. If input RESET is raised high and input RESET_C is consequently brought low, then the D-flip-flop will reset its true output OUTPUT to a logic low and set its complement output OUTPUT_C to a logic high irrespective of the state of all other inputs.

It is to be understood that although this is a differential circuit, the rising edge of a signal may be defined as the rising of the signal voltage above its complement signal voltage. Or in other words, the difference between true and complement signal going from negative to positive. The falling edge may be defined as the falling of a signal voltage below its complement signal voltage. Or in other words, the difference between true and complement signal going from positive to negative. Since the present embodiment is implemented in CML logic, transitions between logic high and logic low levels of the true and complement signals do not correspond to voltage swings from a first power rail to a second power rail. Rather, logic transition may correspond to transitions between a first voltage level, such as the first power rail, for example, to an intermediate voltage level determined by its bias current, pull-up resistor, and the first power rail.

Figure 3:
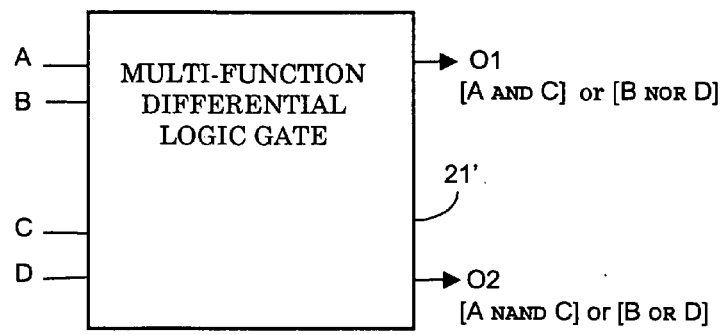
FIG. 3 is a block diagram of a multi-function differential logic gate in accord with the present invention.

Differential AND gate 21 is preferably implemented using a multi-function differential logic gate 21', as shown is FIG. 3. Differential logic gate 21' has four inputs A–D and two outputs O1 and O2. Depending on how inputs A–D are used, differential logic gate 21' may be made to function as a differential AND gate or a differential OR gate. Preferably, inputs A–D are divided into two differential signal groups, each having two inputs. Each differential signal group consists of a true signal and its logic complement. Either input in each group may be designated the true signal, and the other input in the group is thus defined as its logic complement. By assuring that one signal in each group receives a true signal and the other receives its logic complement, the logical function of differential logic gate 21' may be switched from that of a differential AND gate to that of a differential OR gate without requiring any alterations to the internal structure of multi-function, differential logic gate 21'.

In the present example, inputs A and B constitute one signal group and inputs C and D constitute a second signal group. If input A is designated the true input in the first group and input C is designate the true input in the second group, then first output O1 will be designated the true output producing the logical function A AND C and second output O2 will be designated the complement output producing the logical function A NAND C. However, if input B is designated the true input in the first group and input D is designate the true input in the second group, then second output O2 will be designated the true output producing a logical function B OR D and first output O1 will be designated the complement output producing a logical function B NOR D.

Figure 4:
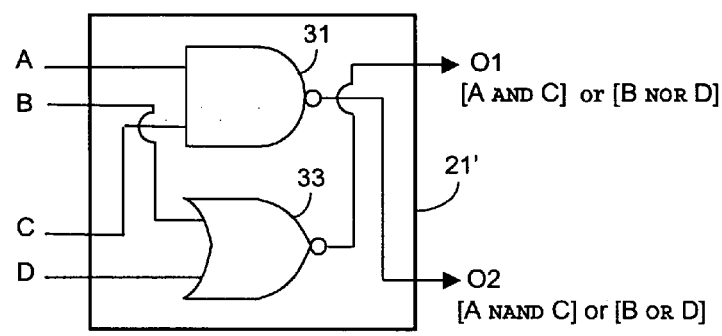
FIG. 4 is a logic diagram of the multi-function differential logic gate of FIG. 3.

With reference to FIG. 4, a logic level implementation of multi-function differential logic gate 21' includes a single-ended NAND gate 31 and a single-ended NOR gate 33. The present implementation assumes, as in the above discussion, that inputs A and B are form the first signal group and inputs C and D form the second input group. Thus, input A is coupled to a first input of NAND gate 31 and input B is coupled to a first input of NOR gate 33. Similarly, input C is coupled to the second input of NAND gate 31 and input D is coupled to the second input of NOR gate 33. The output of NOR gate 33 is coupled to first output O1 and the output of NAND gate 31 is coupled to second output O2.

If one assumes that multi-function differential logic gate 21' is to be implemented as a differential AND gate, then inputs A and C are designated the true inputs and inputs B and D are designated the complement inputs. Basically, this means that inputs A and C are used as the customary inputs of a single-ended AND gate, and inputs B and D must receive logic complements of inputs A and C, respectively. Thus, when input A receives a logic high, input B must receive a logic low, and when input A receives a logic low, then input B must receive a logic high. Also, when input C receives a logic high, input D must receive a logic low, and when input C receives a logic low, input D must receive a logic high. For example, if inputs A and C both receive logic high signals, meaning that inputs B and D both receive logic low signals, then the output of NAND 31 will be low and the output of NOR gate 33 will be high, which produce the expected logic levels at outputs O1 and O2 for a differential AND gate. The truth table for this operation is summarized below, where inputs A and C, and their complements B and D are grouped to separately for ease of explanation.

| True Truth Table | | | | Complement Truth Table | | | |
|---|---|---|---|---|---|---|---|
| A | C | O1 | O2 | B | D | O1 | O2 |
| 0 | 0 | 0 | 1 | 1 | 1 | 0 | 1 |
| 0 | 1 | 0 | 1 | 1 | 0 | 0 | 1 |
| 1 | 0 | 0 | 1 | 0 | 1 | 0 | 1 |
| 1 | 1 | 1 | 0 | 0 | 0 | 1 | 0 |

O1 = A AND C
O2 = A NAND C

On the other hand, if one assumes that multi-function differential logic gate 21' is to be implemented as a differential OR gate, then inputs B and D are designated the true inputs and inputs A and C are designated the complement inputs. Therefore, inputs B and D are used as the customary inputs of a single-ended OR gate, and inputs A and C receive logic complements of inputs B and D, respectively. Thus, when input B receives a logic high, input A must receive a logic low, and when input B receives a logic low, then input A must receive a logic high. Also, when input D receives a logic high, input C must receive a logic low, and when input D receives a logic low, input C must receive a logic high. The truth table for this operation is summarized below, where inputs B and D, and their complements A and C are grouped separately for ease of explanation.

| True Truth Table | | | | Complement Truth Table | | | |
|---|---|---|---|---|---|---|---|
| B | D | O1 | O2 | A | C | O1 | O2 |
| 0 | 0 | 1 | 0 | 1 | 1 | 0 | 1 |
| 0 | 1 | 0 | 1 | 1 | 0 | 1 | 0 |
| 1 | 0 | 0 | 1 | 0 | 1 | 1 | 0 |
| 1 | 1 | 0 | 1 | 0 | 0 | 1 | 0 |

O2 = B OR D
O1 = B NOR D

Figure 5:
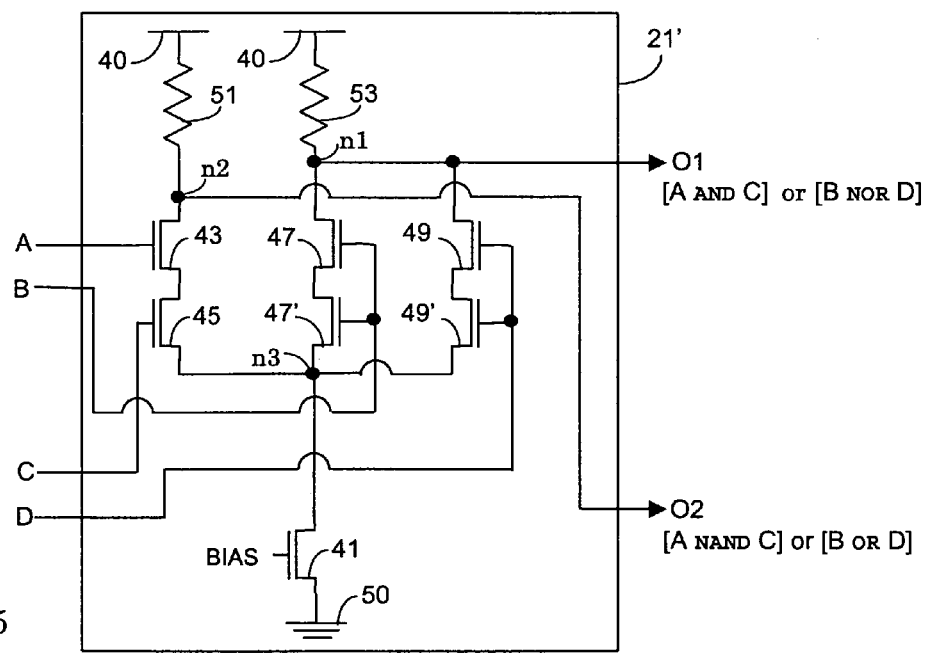
FIG. 5 is a device level diagram of a CML implementation of the multi-function differential logic gate of FIG. 3.

A transistor level, current mode logic (CML) implementation of the structure of FIG. 4 is shown in FIG. 5. Transistor 41 functions as a current source controlled by signal BIAS, and establishes the operating point for multi-function, differential logic gate 21'. That is, transistor 41 is biased by a DC signal BIAS into saturation to form a constant current source. The current through transistor 41 is shunted through either of load resistors 51 or 53 depending on the values of inputs A and C and their corresponding logic complements B and D.

As it is known in the art, CML logic circuits operate by steering current along different paths from one power rail 40, to a second power rail 50. The direction taken by the current path determines the logic level of a signal. When the direction of a current path is changed, typically at least one node will drop in potential to a CML logic low level while another will rise to a CML logic high level. Unlike voltage based circuits, CML logic levels do not swing their outputs from first to second power rails. Rather, CML circuits typically swing their outputs from a first power rail to an intermediate voltage determined by the bias current, pull-up resistor, and first power rail. Nonetheless, by identifying the direction of the shift in potential of two nodes, one can determine the direction of the current path and thereby the logic level being conveyed. Since logic levels are determined by identifying the direction of a current path, as opposed to the rising and lowering of a single node potential to predefined voltage levels (as is done in more traditional, single-ended, voltage based circuits), current mode logic can transfer information at higher speeds with lower noise generation and higher common mode noise tolerance than voltage based circuits.

Resistor 51 and series connected transistors 43 and 45 implement a NAND function, such as NAND gate 31 of FIG. 4. If either of inputs A or C is at a logic low, then the current path from node n2 to second power rail 50 will be cut-off and resistor 51 will raise node n2, and by direct extension raise output O2, toward the higher power rail 40 to a CML logic high level. The actual voltage level on O2 is determined by the amount of load current drawn through resistor 51. Simultaneously at least one of inputs B or D, which receive the logic complements of inputs A and C, will have a logic high and establish a current path from node n1 through either of transistor pairs 47/47' or 49/49' to the second power rail 50, i.e. ground, through current source 41. As a result, the current from node n1 is steered through node n3 and current source 41 toward ground 50, and node n1 is brought to a CML logic low voltage level. This low voltage value is determined by the voltage divider of resistor 53 and the resistances of active transistors in the pull-down path, 47/47' and 41 or 49/49' and 41.

Conversely, if both of inputs A and C are at a logic high, meaning that both of inputs B and D are at logic low, then transistors 43 and 45 will be ON while both of transistor pairs 47/47' and 49/49' would be OFF. Therefore, the current path at node n3 will be steered away from node n1 to node n2, and establish a logic low at node n2 and output O2. Consequently, node n1 is pulled high by resistor 53 and thereby places a logic high on node n1 and output O1.

Since both transistors in each of series connected transistor pairs 47/47' and 49/49' are coupled together to their respective control input, B or D, it is to be understood that both transistors in each pair function in unison. Two transistors per input B and D are preferred in order to more easily maintain a load balance with transistors 43 and 45, and thereby ensure that the low level of O1 is the same as the low level of O2. However, each transistor pair could be replaced with a single large transistor whose impedance balances that of transistors 43 and 45.

Resistor 53 along with transistor pairs 47/47' and 49/49' implement a NOR function similar to NOR gate 33 of FIG. 4. If either of inputs B or D is at a logic high, then a current path from node ni1 to ground 50 via node n3 and current source 41 will be established, and output O1 will be brought to a logic low. Simultaneously, at least one of inputs A or C will have received a logic low (the logic complement), and thus cut-off the current path from node n2 to ground 50.

Therefore, resistor 51 will raise node n2, and consequently output O2, to a logic high level. However, if both of input B and D are at a logic low and both of inputs A and C are at a logic high, then transistor pairs 47/47' and 49/49' will be turned OFF while transistors 43 and 45 will be turned ON. Consequently, the current path from node n1 to ground 50 will be cut-off while the current path from node n2 to ground 50 is established. As a result, resistor 53 will raise node n1 toward the higher power potential 40 while node n2 is lowered toward ground 50. This places a logic high on output O1 and a logic low on output O2, as expected.

Figure 6:
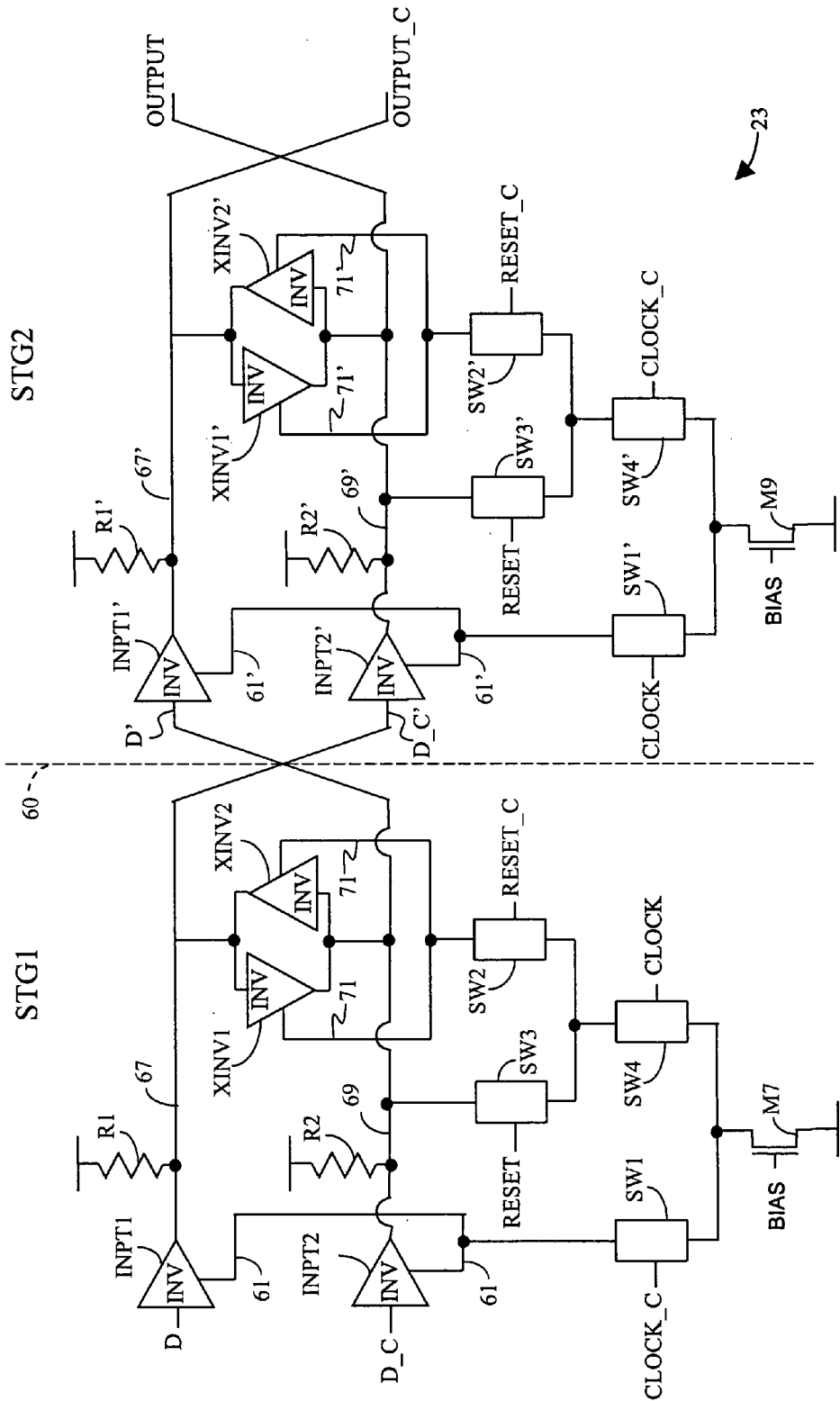
FIG. 6 is a simplified block diagram of a differential D-flip-flop in accord with the present invention.

With reference to FIG. 6, a CML implementation of differential D-flip-flop 23 is divided into a first stage STG1 and a second stage STG2. For ease of explanation, stages STG1 and STG2 are shown separated by a vertical dotted line 60. It is to be understood that differential D-flip-flop 25 is substantially similar to D-flip-flop 23, and the present explanation of D-flip-flop 23 is therefore equally applicable to D-flip-flop 25.

First stage STG1 and second stage STG2 latch in, and hold, data during opposite phases of the true clock's cycle. Preferably, first stage STG1 tracks input data during the low phase of true clock signal CLOCK, latches in the tracked input data on the rising edge of signal CLOCK and holds the latched data during the logic high phase of the signal CLOCK. Also preferably, second stage STG2 latches in the held data from stage STG1 at the falling edge of true clock signal CLOCK, holds and outputs its latched data during the low phase of signal CLOCK, and tracks and transfers to its output latched data from STG1 during the high phase of signal CLOCK. It is to be understood that this is purely a preference and that the response of the first STG1 and second STG2 stages to the high and low phases of the true clock signal's cycle may be reversed without deviating from the present invention.

As explained above in reference to FIG. 2, D-flip-flop 23 latches in input data on the rising edge of true clock signal CLOCK and simultaneously outputs valid data. Also, D-flip-flop 23 preferably tracks input data at input nodes D and D_C while complementary clock signal CLOCK_C is high (and true clock signal CLOCK is therefore low), and tri-states its inputs D and D_C (i.e. stops tracking input data signals at nodes D and D_C) when complementary clock signal CLOCK_C is low (meaning that true clock signal CLOCK has risen high and has therefore latched in any previously tracked data at inputs D and D_C).

In reference to first stage STG1, true input D and complementary input D_C are applied to respective input amplifiers INPT1 and INPT2. Each input amplifier, INPT1 and INPT2, is turned off, or tri-stated, in response to a control line 61. When an input amplifier is enabled, i.e. not turned off or tri-stated, it will output an amplified representation of an applied input signal. In the present case, input amplifiers INPT1 and INPT2 are preferably inverting amplifiers and thus produce an inverted representation of data signals applied at their respective inputs, D and D_C. It is to be understood that inverting input amplifiers INPT1 and INPT2 may be digital inverters, or NOT gates, in which case their outputs will be digital signals whose values are the logical inverse of their input signals.

It is further preferred that control line 61 be the grounding line of inverting input amplifiers INPT1 and INPT2. In this manner, input amplifiers INPT1 and INPT2 may be enabled and disabled by respectively coupling and decoupling control line 61 to, and from, current source M7 and ground 50. Current source M7 is preferably implemented as a transistor under the control of signal BIAS for establishing the operating point for first stage STG1 of D-flip-flop 23. By using grounding line 61 as a control input for input amplifiers INPT1 and INPT2, the enabling and disabling of input amplifiers INPT1 and INPT2 can be easily controlled by complementary clock signal CLOCK_C, which selectively couples and decouples line 61 to and from current source M7 and ground 50 by use of a first switch SW1. It is to be understood that switch SW1 may be a transmission gate or any type of current switching device, such as a single-transistor current pass device.

Pull-up resistors, or load resistors, R1 and R2 are coupled to the respective outputs 67 and 69 of input amplifiers INPT1 and INPT2. It is to be understood that input inverters INPT1 and INPT2 are sized such that when they are enabled, they are capable of pulling high or pulling low their respective outputs 67 and 69 irrespective of the pull-up tendency of respective pull-up resistors R1 and R2. That is, the size of pull-up resistors R1 and R2 and the current draining strengths of input amplifiers INPT1 and INPT2 are chosen such that pull-up resistors R1 and R2 do not pose too high a burden on the ability of input amplifiers INPT1 and INPT2 to pull low their respective outputs 67 and 69. However, when input amplifiers INPT1 and INPT2 are disabled, i.e. tri-stated, pull-up resistors R1 and R2 are effective for pulling high output nodes 67 and 69, unless they are pulled low by another device as explained below.

The outputs of input amplifiers INPT1 and INPT2 are coupled to two cross-coupled inverting amplifiers XINV1 and XINV2, which comprise a latching circuit. Specifically, output 67 from input inverter INPT1 is coupled to the input of cross-coupled inverting amplifier XINV1 and to the output of cross-coupled inverting amplifier XINV2. Similarly, output 69 from input inverter INPT2 is coupled to the input of XINV2 and to the output of XINV1. It is to be understood that inverting amplifiers XINV1 and XINV2 may be logic inverters. Preferably, inverting amplifiers XINV1 and XINV2 are selectively enabled and disabled (i.e. tri-stated) by means of control line 71. Like in the case of input amplifiers INPT1 and INPT2, it is preferred that control line 71 be a grounding path for inverting amplifiers XINV1 and XINV2, and the enabling and disabling of XINV1 and XINV2 is accomplished by the coupling and decoupling of grounding line 71 to and from current source M7 and ground 50. In the present case, grounding line 71 must pass through two stitches, SW2 and SW4, to reach current source M7 and ground 50. Thus, XINV1 and XINV2 are enabled and capable of latching in data only when both switches SW2 and SW4 are closed, i.e. actuated.

Switch SW2 is controlled by complement signal RESET_C, which is high when D-flip-flop 23 is not being reset. Thus, complement signal RESET_C is normally high during normal operation of D-flip-flop 23, and switch SW2 is closed when D-flip-flop is not being reset.

Switch SW4 is controlled by the true clock signal, CLOCK. Therefore, control line 71 is coupled to ground 50 (and latching inverting amplifiers XINV1 and XINV2 are enabled) when signal CLOCK is high and D-flip-flop 23 is not being reset. Therefore during normal use, XINV1 and XINV2 actively latch in any data applied at their inputs via lines 67 and 69 when signal CLOCK is transitions to a high state, and are disabled when signal CLOCK is low.

When signal CLOCK is low, latching amplifiers XINV1 and XINV2 are disabled and lose any previously latched data. During this time, complementary signal CLOCK_C is high causing input amplifiers INPT1 and INPT2 to be enabled and track any input data at their respective input nodes D and D_C. Since INPT1 and INPT2 are enabled, they actively output and apply data to disabled inverters XINV1 and XINV2 along lines 67 and 69, which are also the outputs of STG1 coupled to the inputs of STG2. When complementary signal CLOCK_C goes low, thereby disabling input inverters INPT1 and INPT2, true signal CLOCK goes high and enables XINV1 and XINV2 permitting them to latch in the previously tracked data. The enabling of XINV1 and XINV2 causes them to latch in any data at their input lines 67 and 69. This data is held, and transferred across dotted line 60 to the inputs of the second stage STG2.

The outputs of XINV1 and INPT2, at line 69, are further selectively coupled to SW4 via switch SW3, which is responsive to the true reset signal, RESET. True signal RESET is typically low and is raised high only to reset the data latched in XINV1 and XINV2 to known values. If true signal RESET is asserted, i.e. brought high, while signal CLOCK is low, it will not have much effect on the data contents of XINV1 and XINV2 since inverters XINV1 and XINV2 will already have been disabled by the opening of switch SW4 due to signal CLOCK being low. During this period, complementary clock signal CLOCK_C is high and input amplifiers INPT1 and INPT2 actively track any data at inputs D and D_C. However, second stage STG2 responds to signal RESET to assure that outputs OUTPUT and OUTPUT_C are set to known reset levels irrespective of the state of CLOCK/CLOCK_C, as is explained below.

If true signal RESET is asserted while signal CLOCK is high, a current path will be established from line 69 to ground 50 through switches SW3 and SW4 and through transistor M7. Furthermore, since signal RESET is high, complementary signal RESET_C will be low meaning that inverting amplifiers XINV1 and XINV2 will be tri-stated while input amplifiers INPT1 and INPT2 are also tri-stated by the low level of signal CLOCK_C. As a result, line 69 can be quickly pulled down to a known logic low level by the current path from line 69 through SW3, SW4 and transistor M7, while line 67 can be quickly pulled high to a known logic high level by pull-up resistor R1. When signal RESET is de-asserted (i.e. brought low) and signal RESET_C goes high and enables the latching action of the XINV1 and XINV2, the known logic low of line 69 and the known high of line 67 will be latched in (assuming that signal CLOCK is high).

Since the true and complement signals applied to input node D and D_C, respectively, were inverted by input amplifiers INPT1 and INPT2, respectively, the outputs of the first stage STG1 are crossed as they pass dotted line 60 to second stage STG2. This assures that true input D' of the second stage STG2 receives the latched true data signal, and that complement input D_C' of STG2 receives the complement data signal. By so doing, the structure of the second stage STG2 may be maintain substantially similar to that of the first stage STG1, with the exception of the application of control signals CLOCK and CLOCK_C, which are reversed to ensure that the second stage STG2 operates in opposite phase to the first stage STG1. All elements in stage STG2 similar to those of stage STG1 are therefore identified by similar reference characters as those of STG1 with the addition of a prime symbol ['], and are thus explained above.

In stage STG1, signal CLOCK is applied to switch SW4 to control the enabling and disabling of the internal latch comprised of XINV1 and XINV2, while complement signal CLOCK_C is applied to switch SW1 to control the enabling and disabling of input data tracking components INPT1 and INPT2. By contrast in STG2, signal CLOCK is applied to switch SW1' to control the enabling and disabling of input data tracking components INPT1' and INPT2', while complement signal CLOCK_C is applied to switch SW4' to control the enabling and disabling of the internal latch comprised of XINV1' and XINV2'.

In this manner, control signals CLOCK and CLOCK_C within STG2 are arranged such that while the first stage STG1 is tracking data at its inputs D and D_C and has its internal latch (XINV1/XINV2) disabled, the second stage STG2 has its input tracking components (INV1'/INV2') disabled and its internal latch (XINV1'/XINV2') enabled. Therefore, stage STG2 outputs latched data while stage STG1 tracks new input data. Similarly, when the first stage STG1 has its input tracking components disabled and its internal latch enabled to transfer its latched data to STG2, the second stage STG2 has its internal latch disabled but has its input tracking components enabled to accept (and transfer to outputs OUTPUT/OUTPUT_C) the latched data from the stage STG1. In this manner, D-flip-flop 23 latches in data at inputs D and D_C at the rising edge of signal CLOCK and holds the latched value of the data on output nodes OUTPUT and OUTPUT_C of STG2.

In the above discussion, it is to be understood that switches SW1 to SW4 and switches SW1' to SW4' may be implemented as transmission gates or any other type of current passing control device. In the presently preferred embodiment of FIG. 7, switches SW1, SW2, SW3, SW4, SW1', SW2', SW3', and SW4' of FIG. 6 are respectively implemented as NMOS transistors M3, M21, M19, M6, M8, M13, M15, and M17. As shown, the current path from control line 71 to transistor M7 and ground 50 passes through two NMOS transistors, either though M21 and M6 or through M19 and M6. However in the structure of FIG. 6, control line 61 passed through only one switch, SW1, to reach transistor M7 and ground 50. To balance the current steering operation of STG1, an additional NMOS transistor M18 with its gate coupled to the higher power rail is inserted between control line 61 and transistor M3. In this manner, the current path from control line 61 to transistor M7 and ground 50 also passes through two NMOS transistors, i.e. M18 and M3, and balances the current path from control line 71 to transistor M7 and ground 50. Similarly in STG2, an additional NMOS transistor M10 with its gate coupled to the high power rail in an always ON configuration is inserted between control line 61' and transistor M8 to balance the current path from control line 71 to transistor M9 and ground 50.

Figure 7:
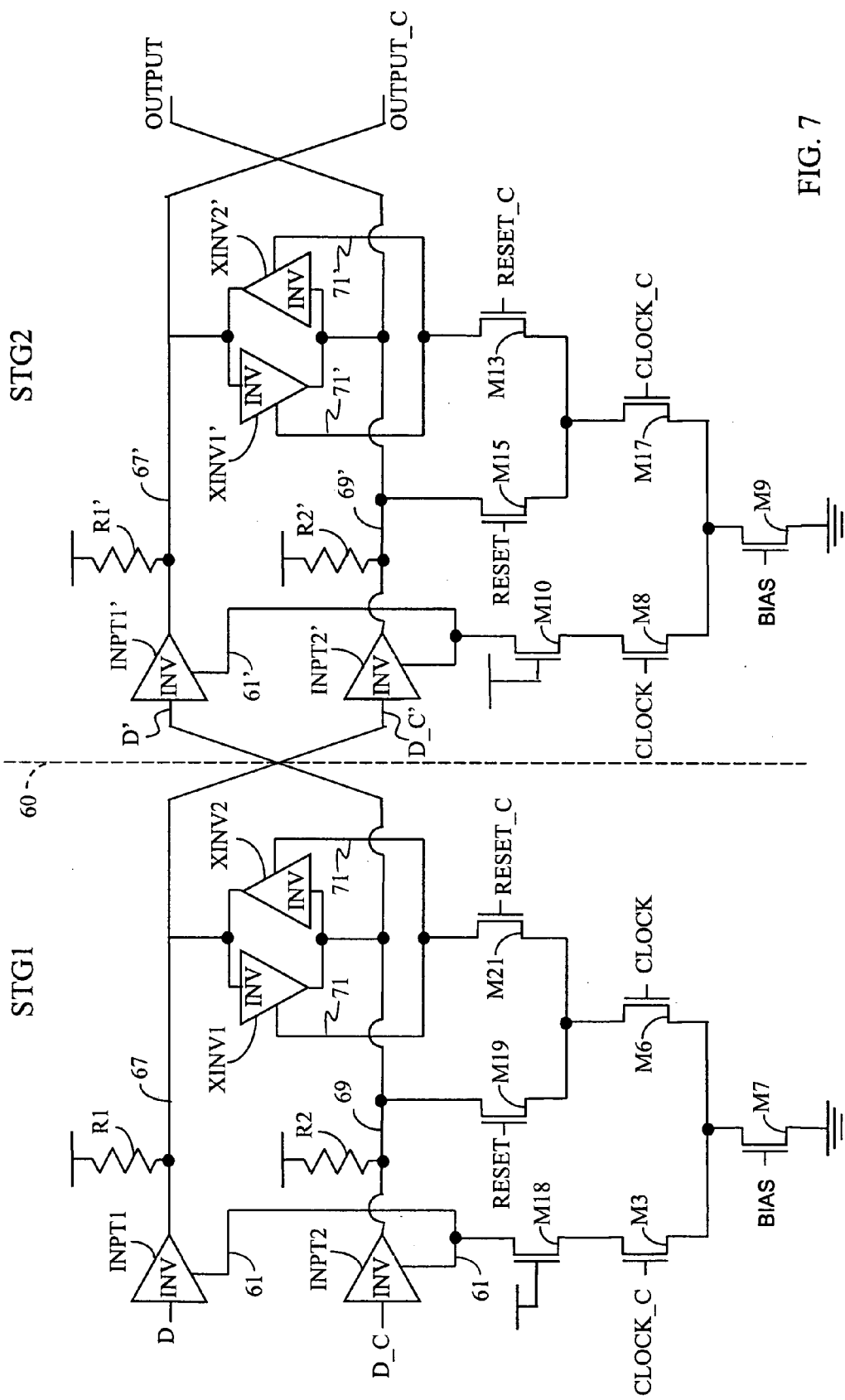
FIG. 7 is a more detailed view of the D-flip-flop of FIG. 6.
Figure 8:
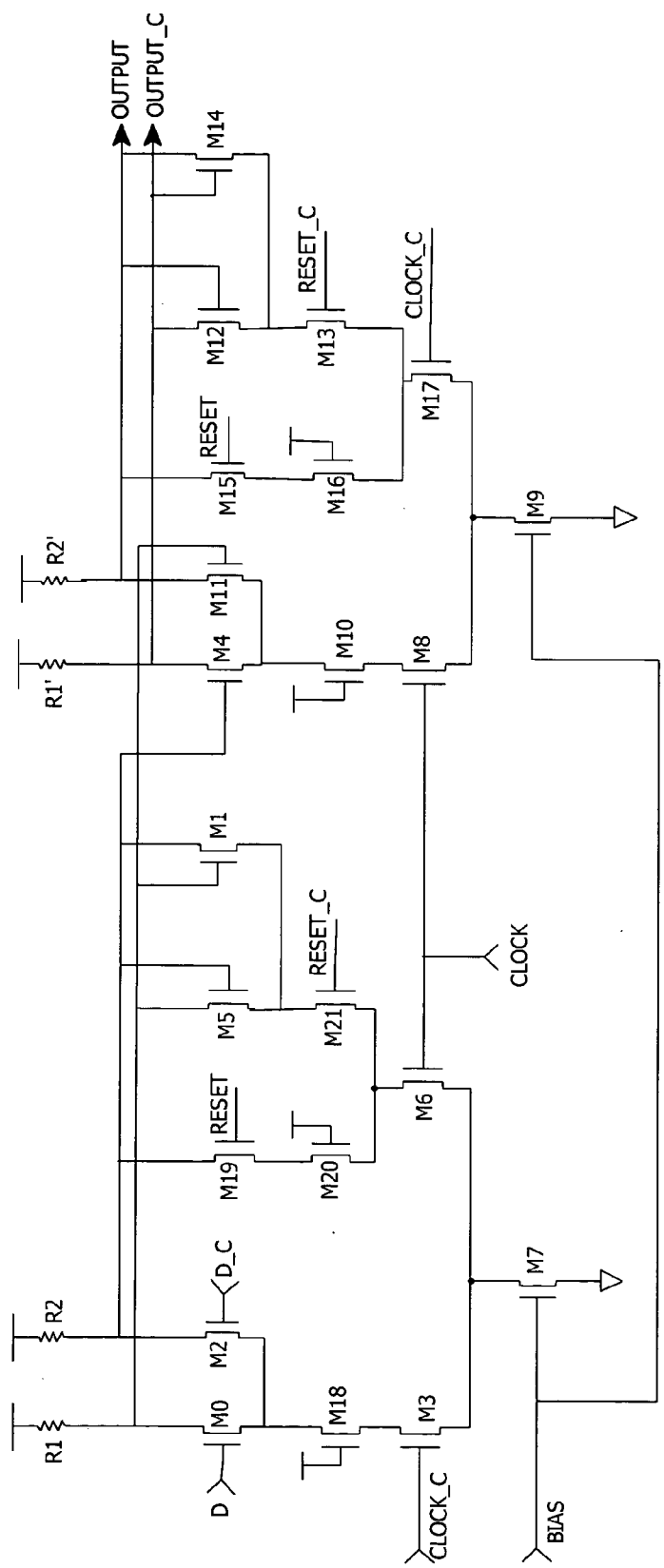
FIG. 8 is a device level implementation of a CML implementation of the differential D-flip-flop of FIG. 7.

With reference to FIG. 8, a transistors level implementation of the structure of FIG. 7 incorporates resistors R1, R2, R1', and R2' into the construct of amplifiers INPT1, INPT2, XINV1, XINV2, INPT1', INPT2', XINV1' and XINV2, as explained more fully below. All elements similar to those of FIG. 7 are identified by similar reference characters and are described above.

In the present embodiment, pull-up resistor R1 is incorporated into the construct of input amplifier INPT1 and inverting amplifier XINV2. Input amplifier INPT1 is thus comprised of transistor M0 coupled to R1, with the input node of amplifier INPT1 being the control gate electrode of M0 and the output of INPT1 being the drain electrode of M0. Similarly, inverting amplifier XINV2 is comprised of transistor M5 couple to R1, with the input of inverting amplifier XINV2 being the control gate electrode of M5 and the output of XINV2 being the drain electrode of M5.

Pull-up resistor R2 is incorporated into the construct of input amplifier INPT2 and inverting amplifier XINV1. Input amplifier INPT2 is thus comprised of transistor M2 coupled to R2, with the input node of amplifier INPT2 being the control gate electrode of M2 and the output of INPT2 being the drain electrode of M2. Similarly, inverting amplifier XINV1 is comprised of transistor M1 couple to R2, with the input of inverting amplifier XINV1 being the control gate electrode of M1 and the output of XINV1 being the drain electrode of M1.

In like manner, pull-up resistor R1' is incorporated into the construct of input amplifier INPT1' and inverting amplifier XINV2'. Input amplifier INPT1' is comprised of transistor M4 coupled to R1', with the input node of amplifier INPT1' being the control gate electrode of M4 and the output of INPT1' being the drain electrode of M4. Similarly, inverting amplifier XINV2' is comprised of transistor M12 couple to R1', with the input of inverting amplifier XINV2' being the control gate electrode of M12 and the output of XINV2' being the drain electrode of M12.

Lastly, pull-up resistor R2' is incorporated into the construct of input amplifier INPT2' and inverting amplifier XINV1'. Input amplifier INPT2' is comprised of transistor M11 coupled to R2', with the input node of amplifier INPT2' being the control gate electrode of M11 and the output of INPT2' being the drain electrode of M11. Similarly, inverting amplifier XINV1' is comprised of transistor M14 couple to R2', with the input of inverting amplifier XINV1' being the control gate electrode of M14 and the output of XINV1' being the drain electrode of M14.

It is further noted that in this configuration another transistor M20 in an always on configuration is needed between transistors M19 and M6 to achieve a balanced circuit in STG1, and another transistor M16 in an always on configuration is needed between transistors M15 and M17 to achieve a balanced circuit in STG2.

As explained above, D-flip-flop 23 is composed of a master/slave pair, embodied as STG1 and STG2, of differential master slave clocked latches. The external BIAS voltage provides the voltage to transistors M7 and M9 to generate two constant current sources, one per latch.

The first stage STG1, which embodies the first latch, is comprised of transistors M0, M2, M19, M5, M1, M18, M20, M21, M3, M6, and M7 along with pull-up resistors R1 and R2, and operates as the master as follows. During the up level of CLOCK_C, the values of the data input D and D_C are tracked by M0 and M2 respectively. This tracking sources the current for M7 from either of resistor R1 R2 through either M0 or M2 and M18 and M3. It is to be understood that resistors R1 and R2 may be combined into a single resistor R, and resistors R1' and R2' may also be combined into resistor R, or another single resistor. Presently, the value tracked is set into M1 and M5 at the rising edge of CLOCK through M6 as long as M21 is on. M21 will be on if there is no reset and RESET_C is high. Any time when CLOCK is high, the assertion of RESET will break the cross-coupled memory in M5 and M1 since M21 will go off and M19 and M20 will be on causing the data value in the first latch to reset.

The second stage STG2, which embodies the second latch, is comprised of transistors M4, M11, M15, M12, M14, M10, M16, M13, M8, M17 and M9 along with resistors R1' and R2', and operates as the slave as follows. The data held in the first latch (from stage STG1) is tracked during the actuation of signal CLOCK by M4 and M11 and transferred to the outputs OUTPUT and OUTPUT_C. The value is held by M12 and M14 during the CLOCK_C phase of the clock as long as the RESET is not high and RESET_C is high. Note that at any time when CLOCK_C is high, RESET going high will immediately reset the outputs via M13 and M15 and M16. When CLOCK is high and CLOCK_C is low, the first latch of STG1 is reset and its reset values immediately transferred to output nodes OUTPUT and OUTPUT_C of STG2. Thus whenever a reset operation occurs, the OUTPUT and OUTPUT_C values will be reset, i.e. OUTPUT will be low and OUTPUT_C high, irrespective of the state of signals CLOCK and CLOCK_C.

Figure 9:
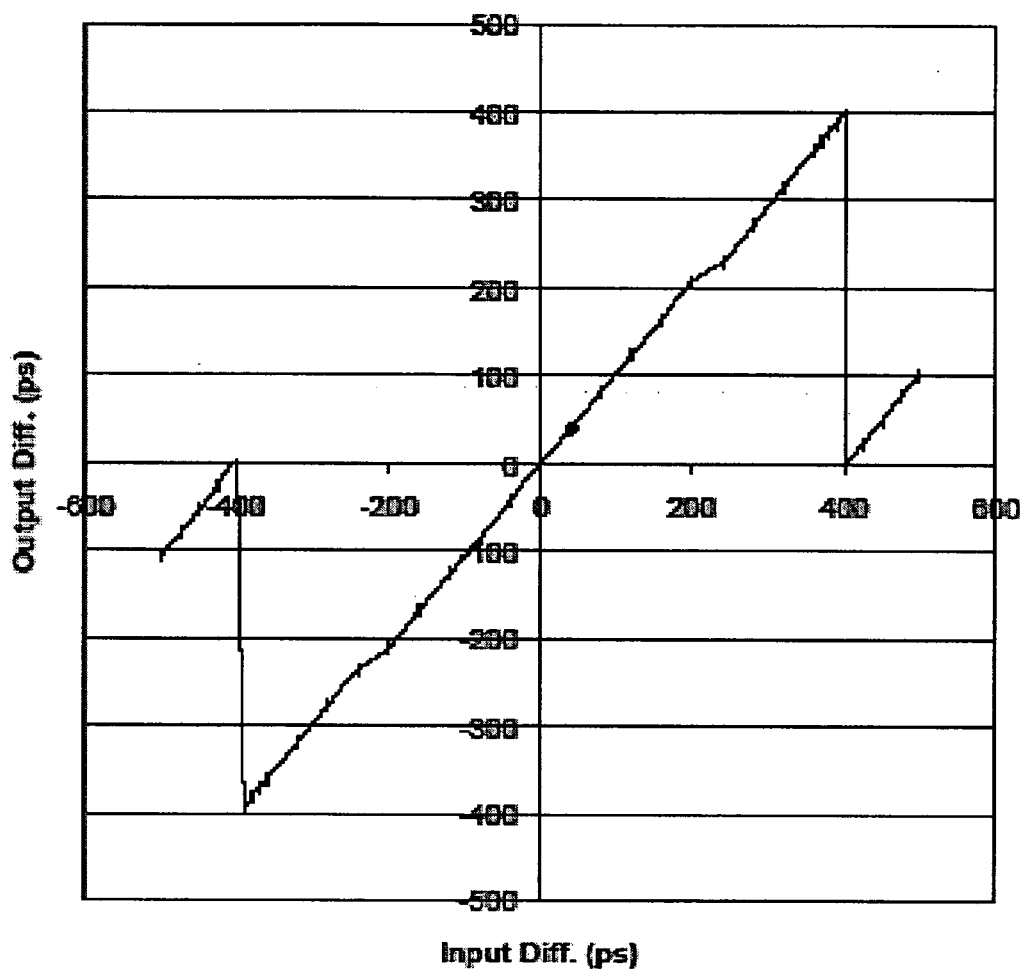
FIG. 9 is a graph showing simulation results of the operation of the circuit of FIG. 2.

With reference to FIG. 9, simulation results of the circuit of FIG. 2 when operating at 2.5 GHz input clock rates shows it to have a high speed of operation and good linearity. The relative phase differences of the two inputs are expressed in psec where 400 psec represent a complete period or a phase shift of $2\pi$ radians. The output characteristic is expressed as the difference in pulse widths between the UP and DOWN outputs in psec.

The present invention has been described in connection with various preferred embodiments thereof with reference to the accompanying drawings. However, various changes and modifications will be apparent to those skilled in the art based on the foregoing description. Such changes and modifications are intended to be included within the scope of the present invention to the extent they fall within the scope of the appended claims.

What is claimed is:

1. A differential phase and frequency detector comprising:
    a first power rail and a second power rail for providing power to said differential phase and frequency detector;
    a differential logic gate having a first gate input for receiving a first gate input signal, a second gate input for receiving a second gate input signal, a third gate input for receiving a third gate input signal, a fourth gate input for receiving a fourth gate input signal, a first gate output for producing a first gate output signal, and a second gate output for producing a second gate output signal, wherein said first and second gate input signals are the logic compliments of each other, said third and fourth gate input signals are the logic compliments of each other, said first gate output signal is the logical AND of said first and third gate input signals and is the logical NOR of said second and fourth gate input signals, and said second gate output signal is the logical OR of said second and fourth gate input signals and is the is the logical NAND of said first and third gate input signals;
    a first differential latch having a first latch input, a second latch input, a first clock input, a second clock input, a first reset input, a second reset input, a first latch output, and a second latch output; and
    a second differential latch having third latch input, a fourth latch input, a third clock input, a fourth clock input, a third reset input, a fourth reset input, a third latch output, and a fourth latch output;
    wherein:
        said first and third latch inputs are coupled to a logic high level;
        said second and fourth latch inputs are coupled to a logic low level;
        said first clock input is coupled to receive a first frequency signal;
        said second clock input is coupled to receive a first complement frequency signal, said first complement frequency signal being the logic complement of said first frequency signal;
        said third clock input is coupled to receive a second frequency signal;
        said fourth clock input is coupled to receive a second complement frequency signal, said second complement frequency signal being the logic complement of said second frequency signal;

said first gate output is coupled to said first and third reset inputs and said second gate output is coupled to said second and fourth reset input;

said first latch output is coupled to said first gate input and said second latch output is coupled to said second gate input, said second latch output being the logic complement of said first latch output; and said third latch output is coupled to said third gate input and said fourth latch output is coupled to said fourth gate input, said fourth latch output being the logic complement of said third latch output.

2. The differential phase and frequency detector of claim 1, wherein said differential logic gate includes:

a NAND logic gate coupled to receive said first and third gate input signals at said first and third gate inputs, wherein the output of said NAND gate is said second gate output; and a NOR logic gate coupled to receive said second and fourth gate input signals at said second and fourth gate inputs, wherein the output of said NOR gate is said first gate output.

3. The differential phase and frequency detector of claim 1, wherein said differential logic gate includes:

a first plurality of series connected transistors respectively responsive to said first gate input and said third input;

a first pass device responsive to said second gate input;

a second pass device responsive to said fourth gate input, said first and second pass devices being coupled in parallel;

a first pull-up device coupling said first plurality of series connected transistors to said first power rail;

a second pull-up device coupling said first and second pass devices to said first power rail;

wherein the junction of said first pull-up device and said first plurality of series connected transistors is said second gate output; and wherein the junction of said second pull-up device, first pass device, and second pass device is said first gate output.

4. The differential phase and frequency detector of claim 3, wherein said differential logic gate further includes:

a current source, wherein said first pair of series connected transistors, first pass device, and second pass device are coupled at a common junction, and said current source couples said common junction to said second power rail.

5. The differential phase and frequency detector of claim 3, wherein said first pass device includes a second plurality of series connected transistors, each having its respective control input responsive to said second gate input.

6. The differential phase and frequency detector of claim 5, wherein said second pass device includes a third plurality of series connected transistors, each having its respective control input responsive to said fourth gate input.

7. The differential logic gate of claim 6, wherein said first, second, and third plurality of series connected transistors are comprised of two transistors each.

8. The differential phase and frequency detector of claim 7, wherein said first, second, and third plurality of series connected transistors are field effect transistors.

9. The differential phase and frequency detector of claim 8, wherein said first and second pull-up devices are pull-up resistors.

10. The differential phase and frequency detector of claim 1, said first differential latch includes:

a first input-stage amplifier for receiving said first latch input;

a second input-stage amplifier for receiving said second latch input;

a first inverting amplifier coupled to the output of said first input-stage amplifier;

a second inverting amplifier coupled to the output of said second input-stage amplifier;

wherein said first and second inverting amplifiers are selectively configured in a cross-coupled feedback loop, whereby the output of said first inverting amplifier is coupled to the input of said second inverting amplifier and the output of said second inverting amplifier is coupled to the input of said first inverting amplifier;

a loop breaking component for selectively breaking said feedback loop; and a shunting component for selectively coupling the input of said second inverting amplifier to said second power rail;

wherein said loop breaking component and said shunting component operate in conjunction with each such that said shunting component couples the input of said second inverting amplifier to said second power rail when said loop breaking component is breaking said feedback loop.

11. The differential phase and frequency detector of claim 10, wherein:

said first power rail has a higher voltage potential than said second power rail;

said first and second input-stage amplifiers are inverting-type amplifiers;

the output of said first input-stage amplifier is directly connected to the input of said first inverting amplifier; and the output of said second input-stage amplifier is directly connected to the input of said second inverting amplifier.

12. The differential phase and frequency detector of claim 10, wherein said shunting component is responsive to said first reset input.

13. The differential phase and frequency detector of claim 12, wherein said loop breaking component is responsive to said second reset input.

14. The differential phase and frequency detector of claim 13, wherein:

said first and second inverting amplifiers are powered through said first and second power rails; and wherein said loop breaking component couples at least one of said first and second inverting amplifiers to receive power from at least one of said first and second power rails when not breaking said feedback loop, and decouples said at least one of said first and second inverting amplifiers to cut-off power from said one of said first and second power rails when breaking said feedback loop, whereby said feedback loop is broken by effectively turning off said at least one of said first and second inverting amplifiers.

15. The differential phase and frequency detector of claim 14, wherein said loop breaking component jointly couples and decouples said first and second inverting latch amplifier to and from said at least one of said first and second power rails to respectively maintain and break said feedback loop.

16. The differential phase and frequency detector of claim 15, wherein:

said shunting component couples the input of said second inverting amplifier and the output of said first inverting amplifier to said second power rail when said first and second inverting amplifiers are disabled by said loop breaking component breaking said feedback loop; and said first input-stage amplifier has a resistive element coupling its output to said first power rail, and said first and second input-stage amplifiers are disabled when said loop breaking component is breaking said feedback loop, whereby said resistive element couples the input of said first inverting amplifier and the output of said second inverting power rail to said first power rail when said first and second inverting amplifiers are disabled by said loop breaking component breaking said feedback loop.

17. The differential phase and frequency detector of claim 10, wherein said loop breaking component and said shunting component are enabled and disabled in accordance with said first clock input.

18. The differential phase and frequency detector of claim 17, wherein said feedback loop is further broken in response to said loop breaking component being disabled.

19. The differential phase and frequency detector of claim 17, wherein said first and second input stage amplifiers are enabled and disabled in accordance with said second clock input.

20. The differential phase and frequency detector of claim 10, wherein said first input-stage amplifier, second input-stage amplifier, first inverting amplifier, second inverting amplifier, loop breaking component, and shunting component constitute a first latching stage, said first differential input latch further having a second latching stage duplicating the components constituting said first latching stage, wherein:

the output of the first input-stage amplifier of said first latching stage is coupled to the input of the second input-stage amplifier of said second latching stage;

the output of the second input-stage amplifier of said first latching stage is coupled to the input of the first input-stage amplifier of the second latching stage;

the output of the second input-stage amplifier of the second latching stage is said first latch output; and the output of the first input-stage amplifier of the second latching stage is said second latch output.

21. The differential phase and frequency detector of claim 20, wherein:

the first inverting amplifier, second inverting amplifier, loop breaking component, and shunting component of said first latching stage are enabled and disabled in accordance with said first clock input;

the first input-stage amplifier and second input-stage amplifier of said first latching stage are enabled and disabled in accordance with said second clock input, said second clock being the logic compliment of said first clock;

the first inverting amplifier, second inverting amplifier, loop breaking component, and shunting component of said second latching stage are enabled and disabled in accordance with said second clock input; and the first input-stage amplifier and second input-stage amplifier of said second latching stage are enabled and disabled in accordance with said first clock input.

22. The differential phase and frequency detector of claim 10, wherein:

said first input-stage amplifier includes a first pull-up resistor coupled to a first input stage transistor having its control input coupled to said first latch input, the junction of said first pull-up resistor and first input stage transistor being the output of said first input-stage amplifier;

said second input-stage amplifier includes a second pull-up resistor coupled to a second input stage transistor having its control input coupled to said second latch input, the junction of said second pull-up resistor and said second input stage transistor being the output of said second input-stage amplifier;

said first inverting amplifier includes a first pass transistor having its control input coupled to said first pull-up resistor for selectively coupling said second pull-up resistor to said loop breaking component;

said second inverting amplifier includes a second pass transistor having its control input coupled to said second pull-up resistor for selectively coupling said first pull-up resistor to said loop breaking component.

23. The differential phase and frequency detector of claim 22, wherein said first and second pass transistors are one of bipolar junction transistors and field effect transistors.

24. The differential phase and frequency detector of claim 22, wherein:

said shunting component is responsive to said first reset input;

said loop breaking component is responsive to said second reset input;

said loop breaking component and said shunting component are enabled and disabled in accordance with said first clock input, and said feedback loop is automatically broken when said loop breaking component is disabled; and said first and second input stage amplifiers are enabled and disabled in accordance with said second clock input;

whereby said first and second input stage amplifiers are active while said first and second inverting amplifiers are disabled by said first clock input, and said first and second input stage amplifiers are disabled while the breaking and establishing of said feedback loop is under control of said loop breaking component.

25. The differential phase and frequency detector of claim 24, further having:

a current source coupled to one of said first and second power rails;

a third pass transistor responsive to said first clock input, for selectively coupling said shunting component and said loop breaking component to said current source;

a fourth pass transistor responsive to said second clock input, for selectively coupling said first and second input stage amplifiers to said current source;

wherein said shunting component, loop breaking component, first input-stage amplifier, and second input-stage amplifier are disabled in response to being decoupled from said current source.

26. The differential phase and frequency detector of claim 22, said first differential latch includes:

a first input-stage amplifier for receiving said first latch input;

a second input-stage amplifier for receiving said second latch input;

a first inverting amplifier coupled to the output of said first input-stage amplifier;

a second inverting amplifier coupled to the output of said second input-stage amplifier;

wherein said first and second inverting amplifiers are selectively configured in a cross-coupled feedback loop, whereby the output of said first inverting amplifier is coupled to the input of said second inverting amplifier and the output of said second inverting amplifier is coupled to the input of said first inverting amplifier;

a loop breaking component for selectively breaking said feedback loop; and a shunting component for selectively coupling the input of said second inverting amplifier to said second power rail;

wherein said loop breaking component and said shunting component operate in conjunction with each such that said shunting component couples the input of said second inverting amplifier to said second power rail when said loop breaking component is breaking said feedback loop.

27. The differential phase and frequency detector of claim 26, wherein:

said first power rail has a higher voltage potential than said second power rail;

said first and second input-stage amplifiers are inverting-type amplifiers;

the output of said first input-stage amplifier is directly connected to the input of said first inverting amplifier; and the output of said second input-stage amplifier is directly connected to the input of said second inverting amplifier.

28. The differential phase and frequency detector of claim 26, wherein:

said first input-stage amplifier includes a first pull-up resistor coupled to a first input stage transistor having its control input coupled to said first latch input, the junction of said first pull-up resistor and first input stage transistor being the output of said first input-stage amplifier;

said second input-stage amplifier includes a second pull-up resistor coupled to a second input stage transistor having its control input coupled to said second latch input, the junction of said second pull-up resistor and said second input stage transistor being the output of said second input-stage amplifier;

said first inverting amplifier includes a first pass transistor having its control input coupled to said first pull-up resistor for selectively coupling said second pull-up resistor to said loop breaking component;

said second inverting amplifier includes a second pass transistor having its control input coupled to said second pull-up resistor for selectively coupling said first pull-up resistor to said loop breaking component.

29. The differential phase and frequency detector of claim 26, wherein said first input-stage amplifier, second input-stage amplifier, first inverting amplifier, second inverting amplifier, loop breaking component, and shunting component constitute a first latching stage, said first differential input latch further having a second latching stage duplicating the components constituting said first latching stage, wherein:

the output of the first input-stage amplifier of said first latching stage is coupled to the input of the second input-stage amplifier of said second latching stage;

the output of the second input-stage amplifier of said first latching stage is coupled to the input of the first input-stage amplifier of the second latching stage;

the output of the second input-stage amplifier of the second latching stage is said first latch output; and the output of the first input-stage amplifier of the second latching stage is said second latch output.

30. The differential phase and frequency detector of claim 29, wherein:

the first inverting amplifier, second inverting amplifier, loop breaking component, and shunting component of said first latching stage are enabled and disabled in accordance with said first clock input;

the first input-stage amplifier and second input-stage amplifier of said first latching stage are enabled and disabled in accordance with said second clock input, said second clock being the logic compliment of said first clock;

the first inverting amplifier, second inverting amplifier, loop breaking component, and shunting component of said second latching stage are enabled and disabled in accordance with said second clock input; and the first input-stage amplifier and second input-stage amplifier of said second latching stage are enabled and disabled in accordance with said first clock input.

31. The differential phase and frequency detector of claim 26, wherein said loop breaking component and said shunting component are enabled and disabled in accordance with said first clock input.

32. The differential phase and frequency detector of claim 31, wherein said feedback loop is further broken in response to said loop breaking component being disabled.

33. The differential phase and frequency detector of claim 31, wherein said first and second input stage amplifiers are enabled and disabled in accordance with said second clock input.

34. The differential phase and frequency detector of claim 26, wherein said shunting component is responsive to said first reset input.

35. The differential phase and frequency detector of claim 34, wherein said loop breaking component is responsive to said second reset input.

36. The differential phase and frequency detector of claim 35, wherein:

said first and second inverting amplifiers are powered through said first and second power rails; and wherein said loop breaking component couples at least one of said first and second inverting amplifiers to receive power from at least one of said first and second power rails when not breaking said feedback loop, and decouples said at least one of said first and second inverting amplifiers to cut-off power from said one of said first and second power rails when breaking said feedback loop, whereby said feedback loop is broken by effectively turning off said at least one of said first and second inverting amplifiers.

37. The differential phase and frequency detector of claim 36, wherein said first and second pass transistors are one of bipolar junction transistors and field effect transistors.

38. The differential phase and frequency detector of claim 36, wherein said loop breaking component jointly couples and decouples said first and second inverting latch amplifier to and from said at least one of said first and second power rails to respectively maintain and break said feedback loop.

39. The differential phase and frequency detector of claim 38, wherein:
said shunting component couples the input of said second inverting amplifier and the output of said first inverting amplifier to said second power rail when said first and second inverting amplifiers are disabled by said loop breaking component breaking said feedback loop; and
said first input-stage amplifier has a resistive element coupling its output to said first power rail, and said first and second input-stage amplifiers are disabled when said loop breaking component is breaking said feedback loop, whereby said resistive element couples the input of said first inverting amplifier and the output of said second inverting power rail to said first power rail when said first and second inverting amplifiers are disabled by said loop breaking component breaking said feedback loop.

40. The differential phase and frequency detector of claim 36, wherein:
said shunting component is responsive to said first reset input;
said loop breaking component is responsive to said second reset input;
said loop breaking component and said shunting component are enabled and disabled in accordance with said first clock input, and said feedback loop is automatically broken when said loop breaking component is disabled; and
said first and second input stage amplifiers are enabled and disabled in accordance with said second clock input;
whereby said first and second input stage amplifiers are active while said first and second inverting amplifiers are disabled by said first clock input, and said first and second input stage amplifiers are disabled while the breaking and establishing of said feedback loop is under control of said loop breaking component.

41. The differential phase and frequency detector of claim 40, further having:
a current source coupled to one of said first and second power rails;
a third pass transistor responsive to said first clock input, for selectively coupling said shunting component and said loop breaking component to said current source;
a fourth pass transistor responsive to said second clock input, for selectively coupling said first and second input stage amplifiers to said current source;
wherein said shunting component, loop breaking component, first input-stage amplifier, and second input-stage amplifier are disabled in response to being decoupled from said current source.

42. A differential phase and frequency detector comprising:
a first power rail and a second power rail for providing power to said differential phase and frequency detector;
a differential AND gate having a first true AND input, a second true AND input, a first complement AND input, a second complement AND input, a true AND output and a complement AND output;
a first differential latch having a first latch input, a second latch input, a first clock input, a second clock input, a first reset input, a second reset input, a first latch output, and a second latch output; and
a second differential latch having third latch input, a fourth latch input, a third clock input, a fourth clock input, a third reset input, a fourth reset input, a third latch output, and a fourth latch output;
wherein:
said first and third latch inputs are coupled to a logic high level;
said second and fourth latch inputs are coupled to a logic low level;
said first clock input is coupled to receive a first frequency signal;
said second clock input is coupled to receive a first complement frequency signal, said first complement frequency signal being the logic complement of said first frequency signal;
said third clock input is coupled to receive a second frequency signal;
said fourth clock input is coupled to receive a second complement frequency signal, said second complement frequency signal being the logic complement of said second frequency signal;
said true AND output is coupled to said first and third reset inputs and said complement AND output is coupled to said second and fourth reset input, said complement AND output being the logic complement of said true AND output;
said first latch output is coupled to said first true AND input and said second latch output is coupled to said first complement AND input, said second latch output being the logic complement of said first latch output; and
said third latch output is coupled to said second true AND input and said fourth latch output is coupled to said second complement AND input, said fourth latch output being the logic complement of said third latch output.

43. The differential phase and frequency detector of claim 42, wherein said true NAND output is the logical NAND of said first and second true NAND inputs and said complement NAND output is the logical AND of said first and second true NAND inputs.

44. The differential phase and frequency detector of claim 42, further comprising a current source coupling said differential NAND gate, said first differential latch, and said second differential latch to a power rail, wherein the current magnitude through said current source is responsive to external bias voltage.

45. The differential phase and frequency detector of claim 44, wherein said differential phase and frequency detector is a current mode logic device.

46. The differential phase and frequency detector of claim 42, wherein
said differential NAND gate includes:
a first plurality of series connected transistors respectively responsive to said first true NAND input and said second true NAND input;
a first pass device responsive to said first complement NAND input;
a second pass device responsive to said second complement NAND input, said first and second pass devices being coupled in parallel;
a first pull-up device coupling said first plurality of series connected transistors to said first power rail;
a second pull-up device coupling said first and second pass devices to said first power rail;
wherein the junction of said first pull-up device and said first plurality of series connected transistors constitute said complement NAND output; and
wherein the junction of said second pull-up device, first pass device, and second pass device constitute said true NAND output.

47. The differential phase and frequency detector of claim 46, wherein said differential input NAND gate further includes a current source, said first pair of series connected transistors, first pass device, and second pass device being coupled at a common junction, and said current source coupling said common junction to said second power rail.

48. The differential phase and frequency detector of claim 46, wherein said first pass device includes a second plurality of series connected transistors, each having its respective control input responsive to said first complement NAND input.

49. The differential phase and frequency detector of claim 48, wherein said second pass device includes a third plurality of series connected transistors, each having its respective control input responsive to said second complement NAND input.

50. The differential phase and frequency detector of claim 49, wherein said first, second, and third plurality of series connected transistors are comprise of two transistors each.

51. The differential phase and frequency detector of claim 50, wherein said first, second, and third plurality of series connected transistors are field effect transistors.

52. The differential phase and frequency detector of claim 51, wherein said first and second pull-up devices are pull-up resistors.

* * * * *